US009933969B2

(12) United States Patent
McShane et al.

(10) Patent No.: US 9,933,969 B2
(45) Date of Patent: Apr. 3, 2018

(54) SECURING ENCODING DATA SLICES USING AN INTEGRITY CHECK VALUE LIST

(71) Applicant: International Business Machines Corporation, Armonk, NY (US)

(72) Inventors: Niall J. McShane, Arlington Heights, IL (US); Jason K. Resch, Chicago, IL (US); Ilya Volvovski, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/357,293

(22) Filed: Nov. 21, 2016

(65) Prior Publication Data

US 2017/0153948 A1 Jun. 1, 2017

Related U.S. Application Data

(60) Provisional application No. 62/260,743, filed on Nov. 30, 2015.

(51) Int. Cl.
*G06F 11/00* (2006.01)
*H03M 13/00* (2006.01)
(Continued)

(52) U.S. Cl.
CPC ............ *G06F 3/0635* (2013.01); *G06F 3/064* (2013.01); *G06F 3/067* (2013.01); *G06F 3/0611* (2013.01);
(Continued)

(58) Field of Classification Search
CPC .... H06F 3/0635; H06F 3/0611; H06F 3/0617; H06F 3/0619; H06F 3/064; H06F 3/0659;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Christine T. Tu
(74) *Attorney, Agent, or Firm* — Garlick & Markison; Timothy W. Markison

(57) ABSTRACT

A method includes retrieving a read threshold number of integrity check value list (ICVL) encoded data slices of a set of ICVL encoded data slices. The method further includes determining whether an appended ICVL of each ICVL encoded data slice of the read threshold number of ICVL encoded data slices substantially match. When the appended ICVL of one of the ICVL encoded does not substantially match the appended ICVL of other ICVL encoded data slices, the method further includes determining a likely cause for the mismatch. When the likely cause is missing a revision update, the method further includes initiate rebuilding of the encoded data slice portion. The method further includes generating an integrity check value for the rebuilt encoded data slice and updating the integrity check value list. The method further includes appending the updated integrity check value list to the rebuilt encoded data slice.

14 Claims, 9 Drawing Sheets

(51) Int. Cl.

| | |
|---|---|
| *G06F 3/06* | (2006.01) |
| *G06F 11/10* | (2006.01) |
| *G06F 11/07* | (2006.01) |
| *G06F 17/30* | (2006.01) |
| *H04L 29/08* | (2006.01) |
| *H03M 13/15* | (2006.01) |
| *H04L 12/18* | (2006.01) |

(52) U.S. Cl.
CPC .......... *G06F 3/0617* (2013.01); *G06F 3/0619* (2013.01); *G06F 3/0659* (2013.01); *G06F 11/0727* (2013.01); *G06F 11/1076* (2013.01); *G06F 11/1092* (2013.01); *G06F 17/30569* (2013.01); *H03M 13/1515* (2013.01); *H03M 13/616* (2013.01); *H04L 12/18* (2013.01); *H04L 67/1008* (2013.01); *H04L 67/1097* (2013.01); *H04L 67/2823* (2013.01)

(58) Field of Classification Search
CPC .. H06F 3/067; G06F 11/0727; G06F 11/1076; G06F 11/1092; G06F 17/30569; H03L 3/1515; H03L 3/616; H04L 12/18; H04L 57/1008; H04L 57/1097; H04L 57/2823
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Saran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

(56) References Cited

OTHER PUBLICATIONS

Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

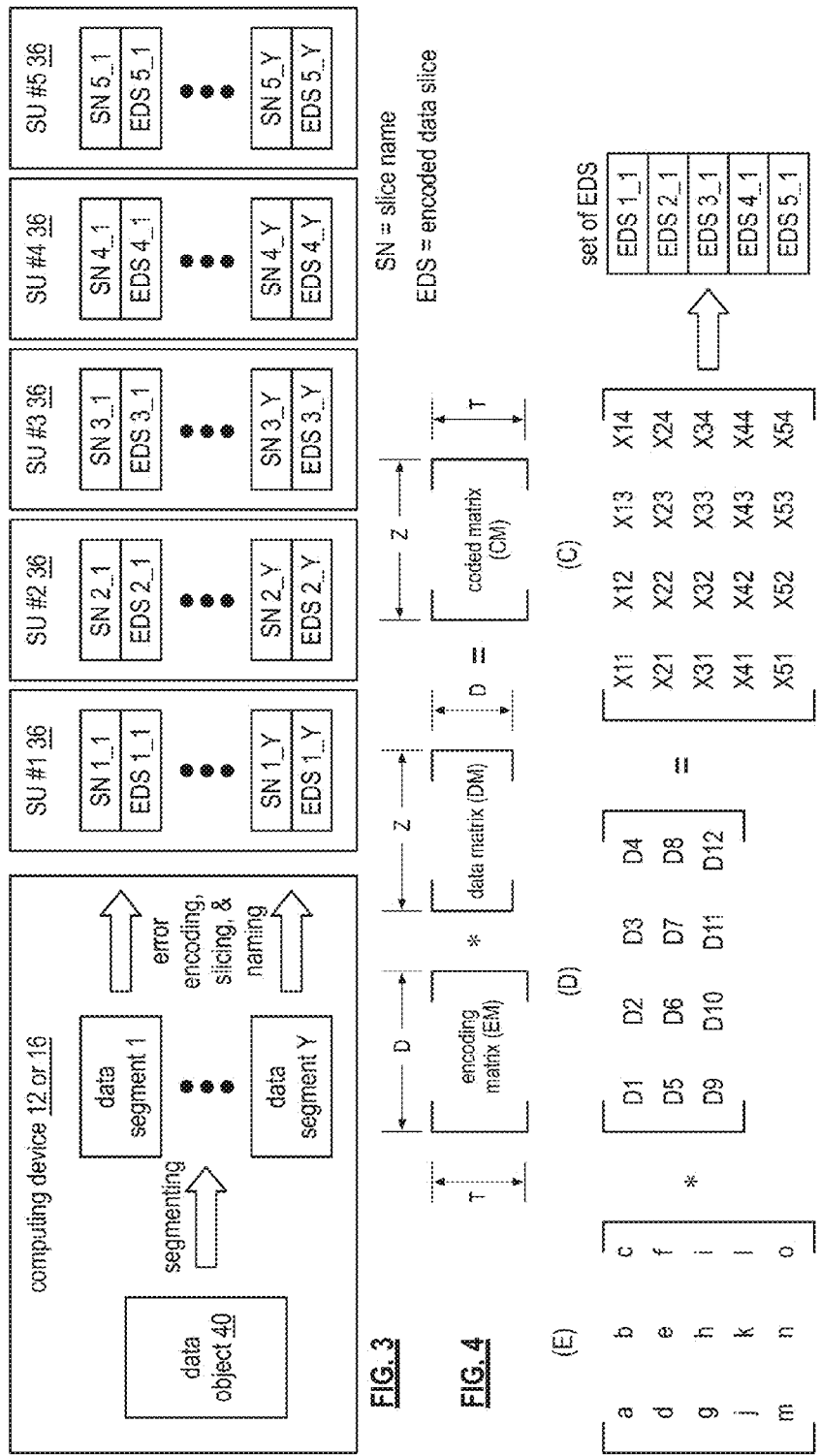

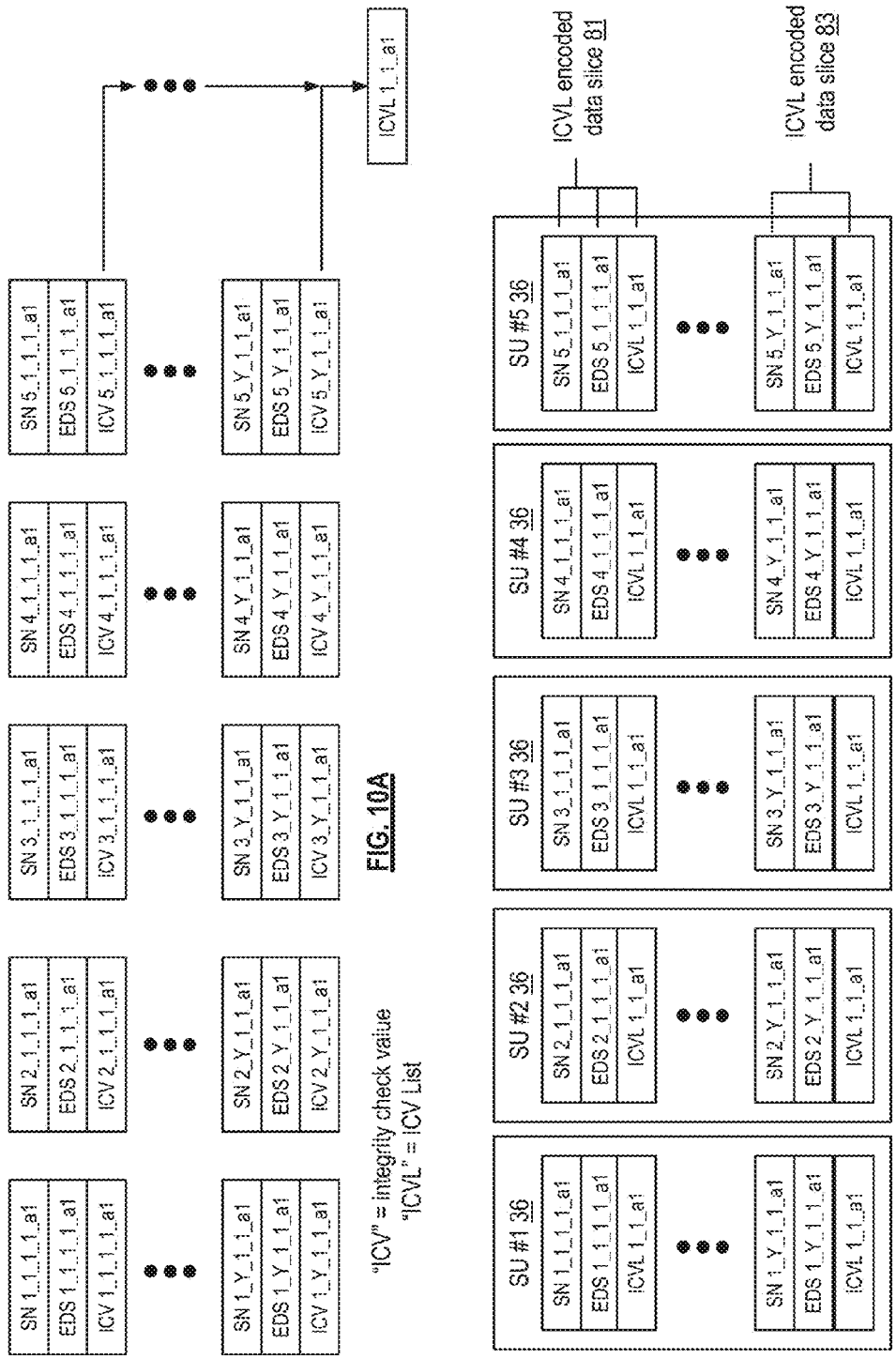

FIG. 11
ICVL matches

FIG. 12
ICVL does not match

FIG. 13

| SN 1_1_1_1_a1 | SN 2_1_1_1_a1 | SN 3_1_1_1_a1 | SN 4_1_1_1_a1 | SN 5_1_1_1_a1 |
| EDS 1_1_1_1_a1 | EDS 2_1_1_1_a1 | EDS 3_1_1_1_a1 | EDS 4_1_1_1_a1 | EDS 5_1_1_1_a1 |
| ICVL 1_1_a1 | ICVL 1_1_a1 | ICVL 1_1_a1 | ICVL 1_1_a1 | ICVL 1_1_a1 | read request ICVL does not match

FIG. 14

| SN 1_1_1_1_a1 | SN 2_1_1_1_a1 | SN 3_1_1_1_a1 | SN 4_1_1_1_a1 | SN 5_1_1_1_a1 |
| EDS 1_1_1_1_a1 | EDS 2_1_1_1_a1 | EDS 3_1_1_1_a1 | EDS 4_1_1_1_a1 | EDS 5_1_1_1_a1 |
| ICVL 1_1_a1 | ICVL 1_1_a1 | ICV 3_1_1_1_a1 | ICVL 1_1_a1 | ICVL 1_1_a1 | read request ICVL does not match

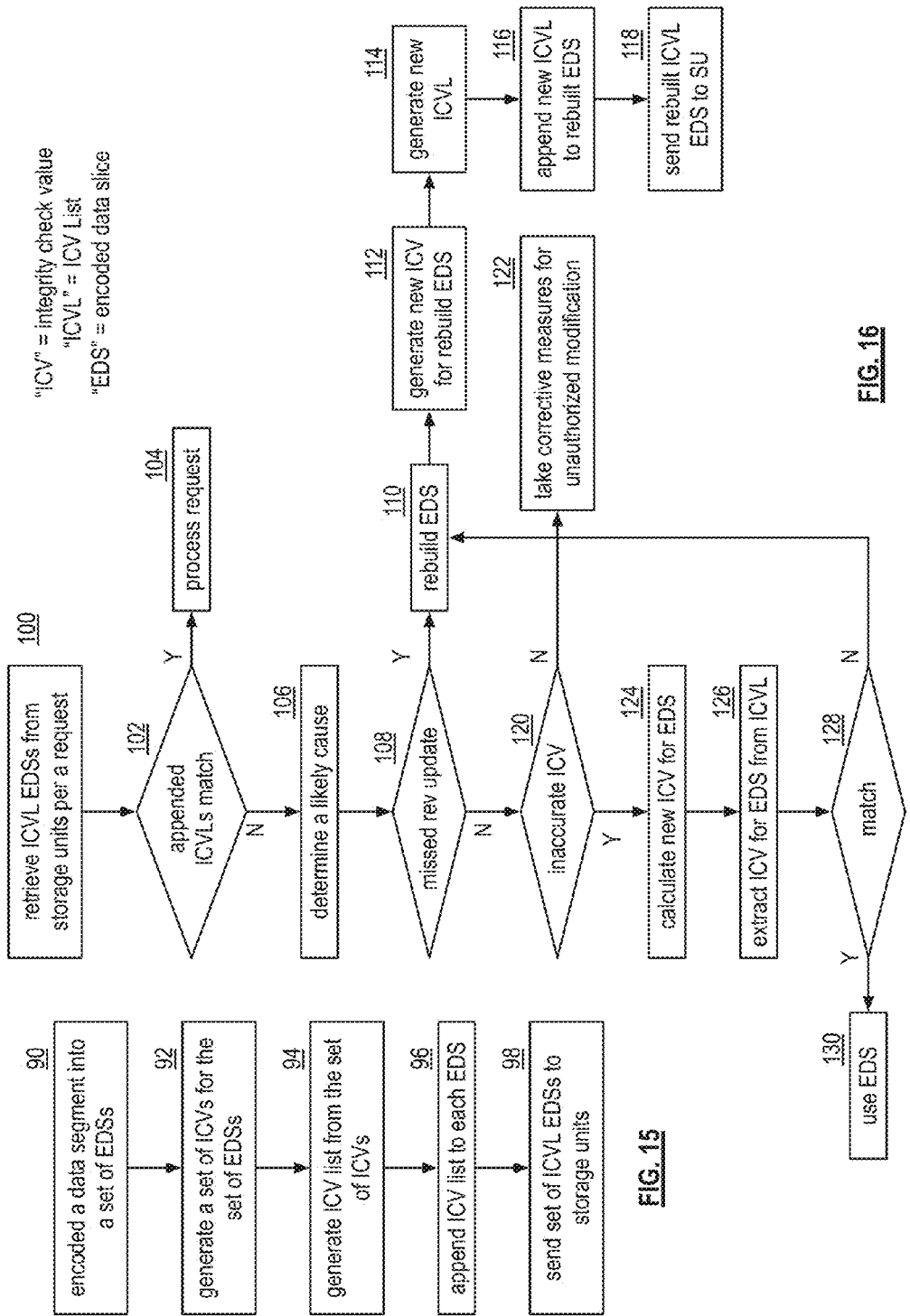

SECURING ENCODING DATA SLICES USING AN INTEGRITY CHECK VALUE LIST

CROSS REFERENCE TO RELATED PATENTS

The present U.S. Utility patent application claims priority pursuant to 35 U.S.C. § 119(e) to U.S. Provisional Application No. 62/260,743, entitled "COMMUNICATING DISPERSED STORAGE NETWORK STORAGE UNIT TASK EXECUTION STATUS", filed Nov. 30, 2015, which is hereby incorporated herein by reference in its entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

For cloud storage systems, security is an on-going challenge. Breach prevention major and breach detection are two primary issues for secure cloud storage operation. Breach prevention is directed towards preventing unauthorized access to the cloud storage system. Breach detection is directed towards detecting a potential unauthorized access, determining with it is unauthorized, and, if it is, taking corrective measures. Such corrective measures includes updating breach detection, removing hardware from the system, attempting to recover compromised data, etc.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 10A is a schematic block diagram of another example of a plurality of sets of encoded data slices (EDS) in accordance with the present invention;

FIG. 10B is a schematic block diagram of another example of a plurality of sets of integrity check value list (ICVL) encoded data slices (EDS) in accordance with the present invention;

FIG. 11 is a schematic block diagram of an example of a set of integrity check value list (ICVL) encoded data slices (EDS) having substantially matching ICVLs in accordance with the present invention;

FIG. 12 is a schematic block diagram of an example of a set of integrity check value list (ICVL) encoded data slices (EDS) having a mismatching ICVL in accordance with the present invention;

FIG. 13 is a schematic block diagram of another example of a set of integrity check value list (ICVL) encoded data slices (EDS) having a mismatching ICVL in accordance with the present invention;

FIG. 14 is a schematic block diagram of another example of a set of integrity check value list (ICVL) encoded data slices (EDS) having a mismatching ICVL in accordance with the present invention;

FIG. 15 is a logic diagram of an example of a method of creating one or more sets of integrity check value list (ICVL) encoded data slices (EDS) in accordance with the present invention; and FIG. 16 is a logic diagram of an example of a method of accessing one or more sets of integrity check value list (ICVL) encoded data slices (EDS) in accordance with the present invention.

DETAILED DESCRIPTION OF THE INVENTION

Figure 1:
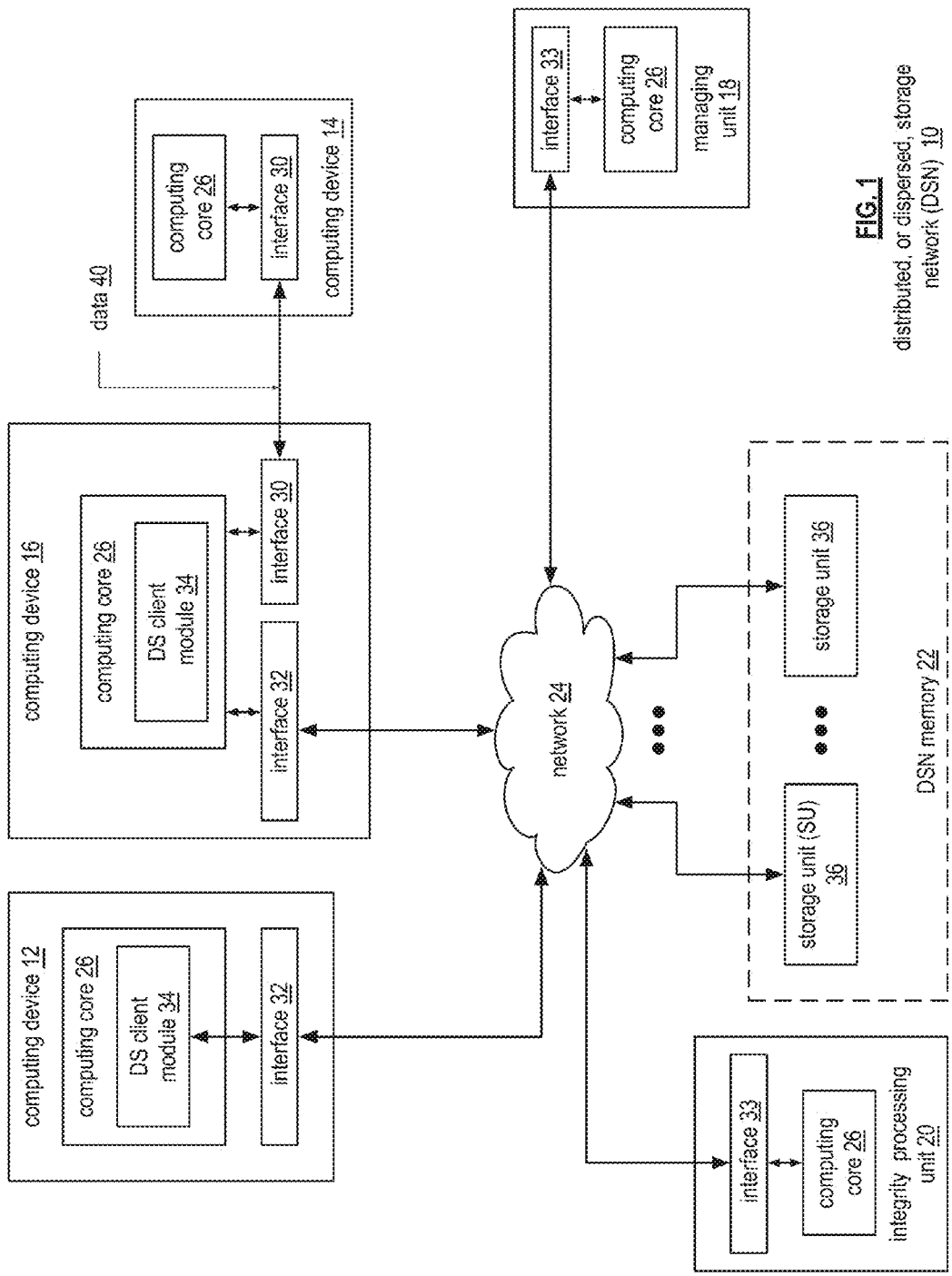
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
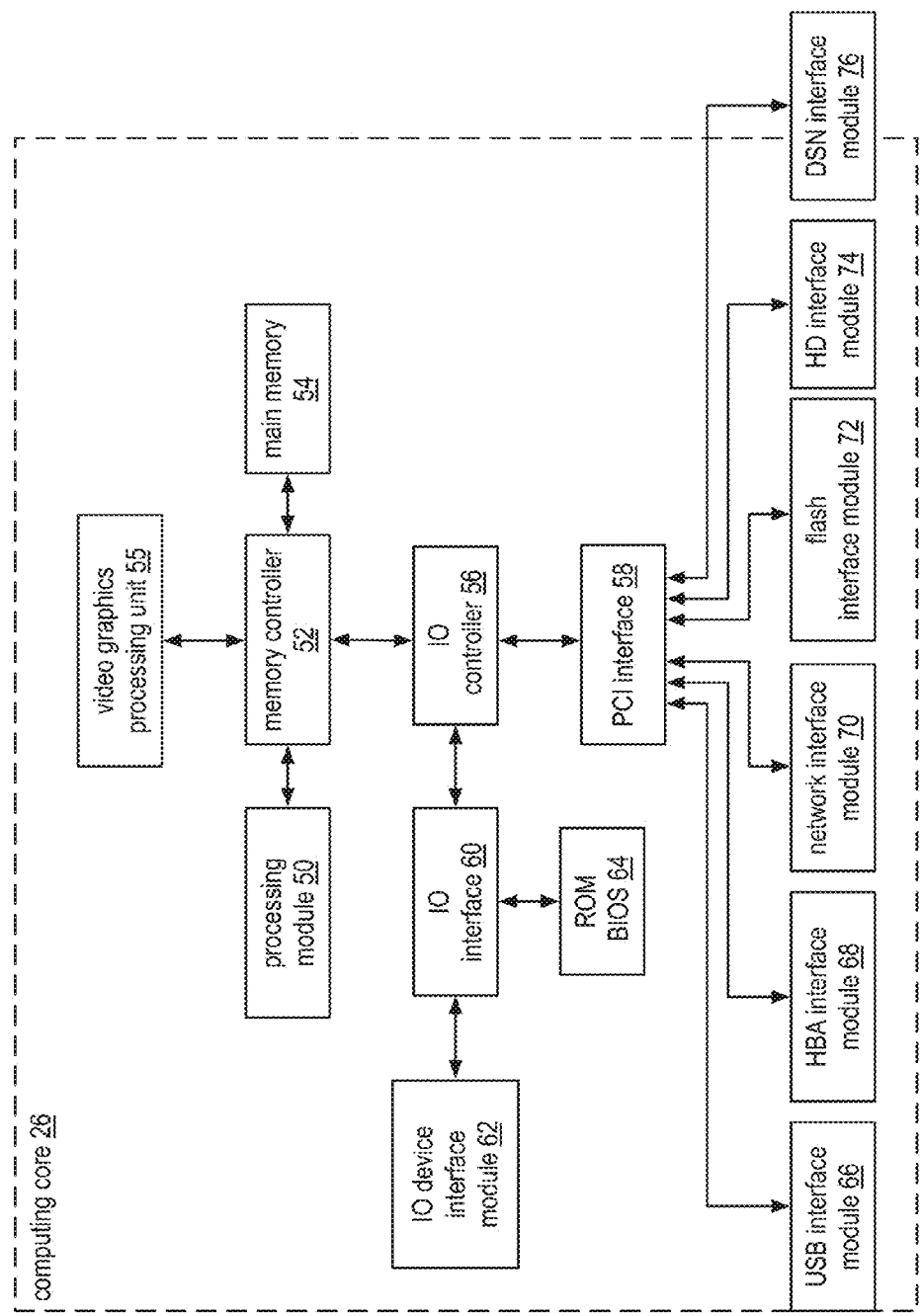
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
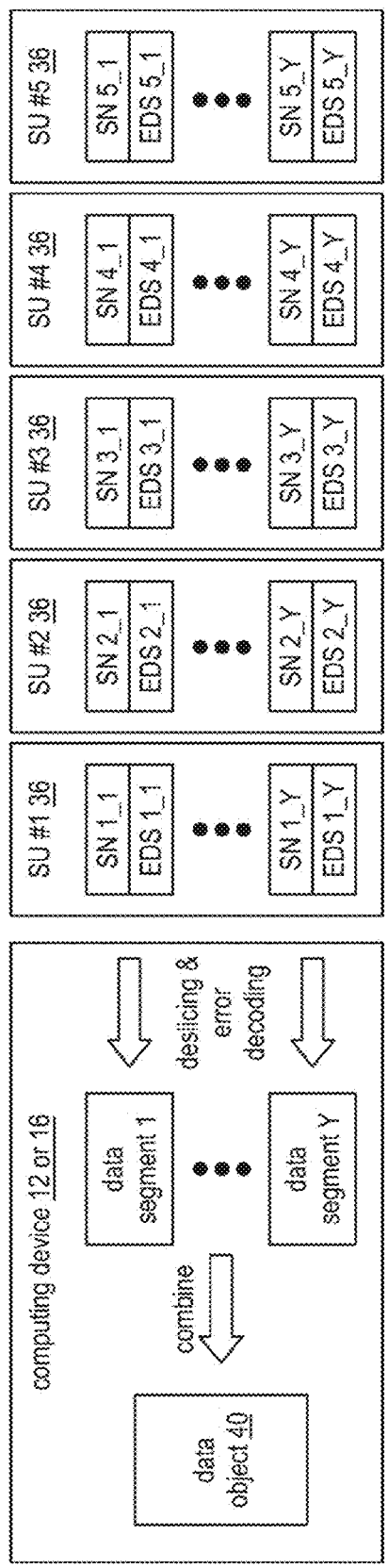
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
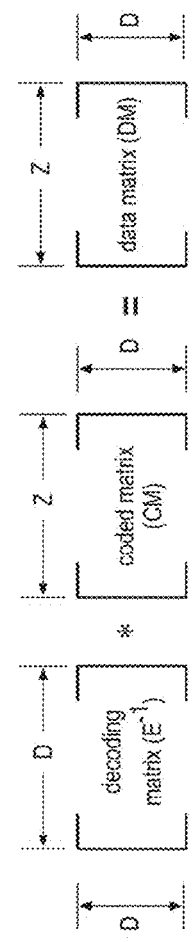
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9A:
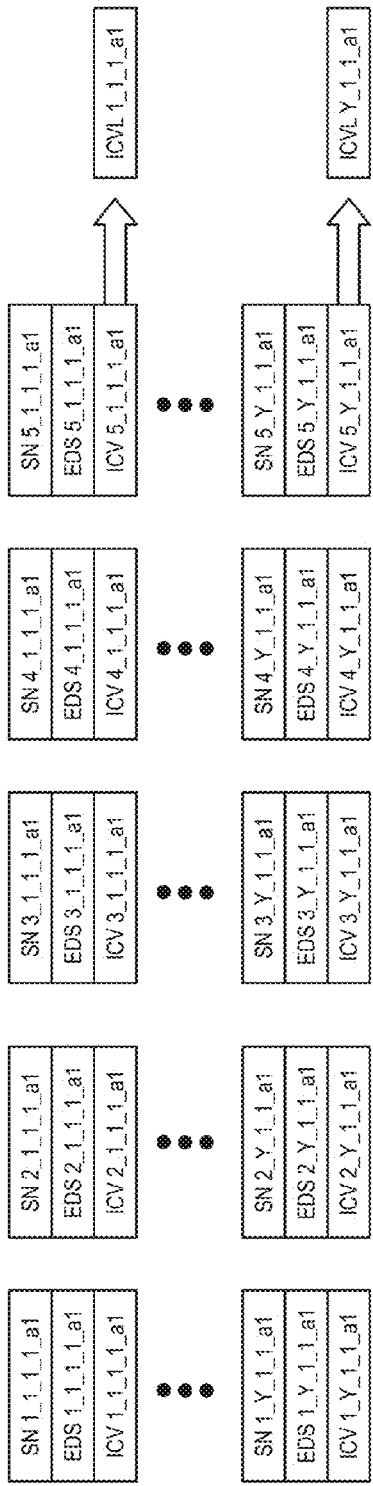
FIG. 9A is a schematic block diagram of an example of a plurality of sets of encoded data slices (EDS) in accordance with the present invention.

FIG. 9A is a schematic block diagram of an example of a plurality of sets of encoded data slices (EDS). As previously discussed, a computing device divides a data object into a plurality of data segments. It then dispersed storage error encodes each data segment to produce a set of encoded data slices and a corresponding set of slice names (SN). In this example, the computing device further generates an integrity check value (ICV) for each encoded data slice (EDS). The ICV may be created in a variety of ways. For example, the ICV is generated using a hash function. As another example, the ICV is generated used a cyclic redundancy check (CRC) function.

An integrity check value list (ICVL) is created from the integrity check values (ICVs) of each encoded data slice (EDS) of a set of encoded data slices. For example, a first data segment is dispersed storage error encoded into a set of EDSs having a set of slice names (SN). In particular, five EDSs and SNs are created for this set: 1_1_1_1_a1; 2_1_1_1_a1; 3_1_1_1_a1; 4_1_1_1_a1; and 5_1_1_1_a1. The first digit of the EDS and SN represents the slice number in the set (e.g., 1-5); The second digit represents the segment number (e.g., 1-Y); the third digit represents the vault number (e.g., a logical storage container of the DSN having one or more user devices affiliated with it); The fourth digit represents the current revision number of the EDS; The fifth value (e.g., a1) represents a data object identifier.

Continuing with the example, for each encoded data slice (EDS) and/or slice name (SN) of the set, an integrity check value is created. As a specific example, an ICV is generated from the encoded data slice, the slice name, or both the encoded data slice and the slice name. For instance, ICV 1_1_1_1_a1 is created for EDS 1_1_1_1_a1 and/or SN 1_1_1_1_a1. The ICVs for the set (e.g., ICV 1_1_1_1_a1 through ICV 5_1_1_1_a1) are combined (e.g., added to the list "as is", mathematically manipulated, etc.) to produce the integrity check value list (IVCL) 1_1_1_a1 (e.g., ICVL regarding the first segment, vault 1, revision number 1 of data object a1). For each set of EDSs, a corresponding ICVL is created.

Figure 9B:
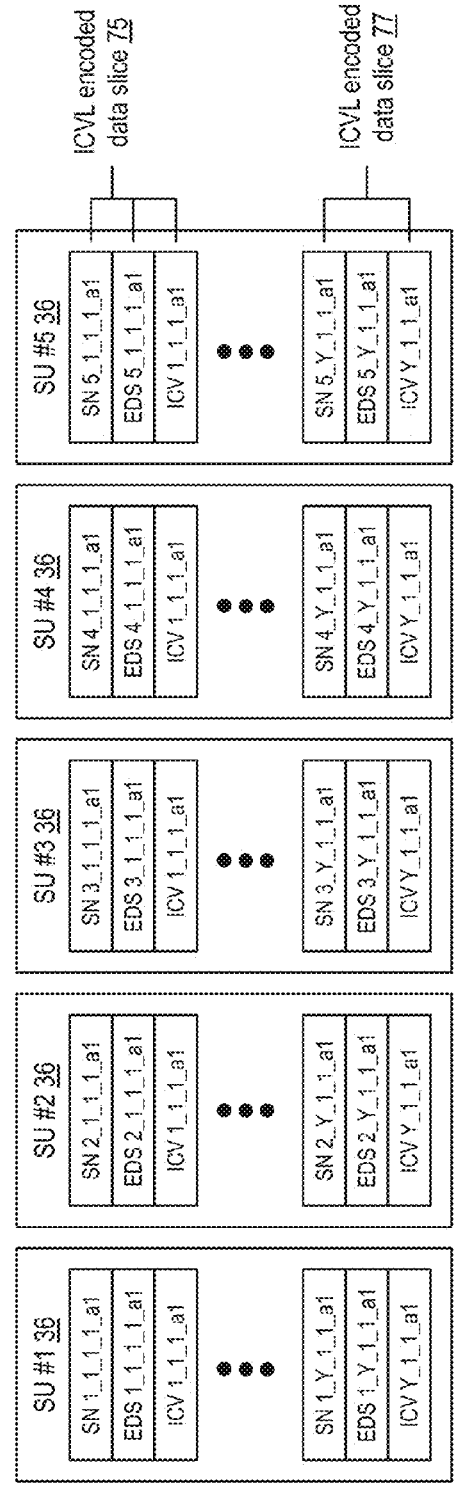
FIG. 9B is a schematic block diagram of an example of a plurality of sets of integrity check value list (ICVL) encoded data slices (EDS) in accordance with the present invention.

FIG. 9B is a schematic block diagram of an example of a plurality of sets of integrity check value list (ICVL) encoded data slices (EDS). Prior to sending the plurality of sets of EDSs to a set of storage units for storage, the computing device appends an ICVL to each EDS to create the plurality of sets of ICVL EDSs. For example, for the first set of encoded data slices (e.g., EDS 1_1_1_1_a1 through EDS 5_1_1_1_a1) the computing device appends ICVL 1_1_1_a1 to each EDS. As another example, for the Yth set of encoded data slices (e.g., EDS 1_Y_1_1_a1 through EDS 5_Y_1_1_a1) the computing device appends ICVL Y_1_1_a1 to each EDS. Once the IVCLs are appended, the computing device sends the set of ICVL EDSs to the set of storage units (e.g., SU #1-SU #5).

Within a storage unit, the ICVL may be affiliated with the slice name and/or the encoded data slice. For example, for a read request, the storage unit affiliates the ICVL with the EDS and SN to produce ICVL encoded data slice 75 and sends the ICVL EDS 75 to the requesting computing device. In another example, such as for a list or rebuild check request, the storage unit affiliates the ICVL with the slice name to produce ICVL encoded data slice 77 and sends ICVL EDS 77 to the requesting device (e.g., computing device or another storage unit).

FIG. 10A is a schematic block diagram of another example of a plurality of sets of encoded data slices (EDS). This example is similar to the one of FIG. 9A, but the integrity check value (ICV) of each EDS of the plurality of sets of EDSs are combined to produce one integrity check value list (ICVL). For instance, ICV 1_1_1_1_a1 through ICV 5_Y_1_1_a1 are combined to produce ICVL 1_1_a1 (e.g., the integrity check value list for vault 1, revision number 1 of data object a1). Note that integrity check value lists may be created for any combination of sets of encoded data slices for one or more data objects. For example, two sets of ICVs (e.g., for two sets of EDSs and/or SNs) are used to produce a single ICVL that is appended to each EDS and/or SN of the two sets.

FIG. 10B is a schematic block diagram of another example of a plurality of sets of integrity check value list (ICVL) encoded data slices (EDS). This is example is similar to the one of FIG. 9B, but each EDS in the plurality of sets of EDSs has appended thereto the same ICVL (e.g., 1_1_a1).

Within a storage unit, the ICVL (e.g., 1_1_a1) may be affiliated with the slice name and/or the encoded data slice. For example, for a read request, the storage unit affiliates the ICVL with the EDS and SN to produce ICVL encoded data slice 81 and sends the ICVL EDS 81 to the requesting computing device. In another example, such as for a list or rebuild check request, the storage unit affiliates the ICVL with the slice name to produce ICVL encoded data slice 83 and sends ICVL EDS 83 to the requesting device (e.g., computing device or another storage unit).

Figures 11, 12:
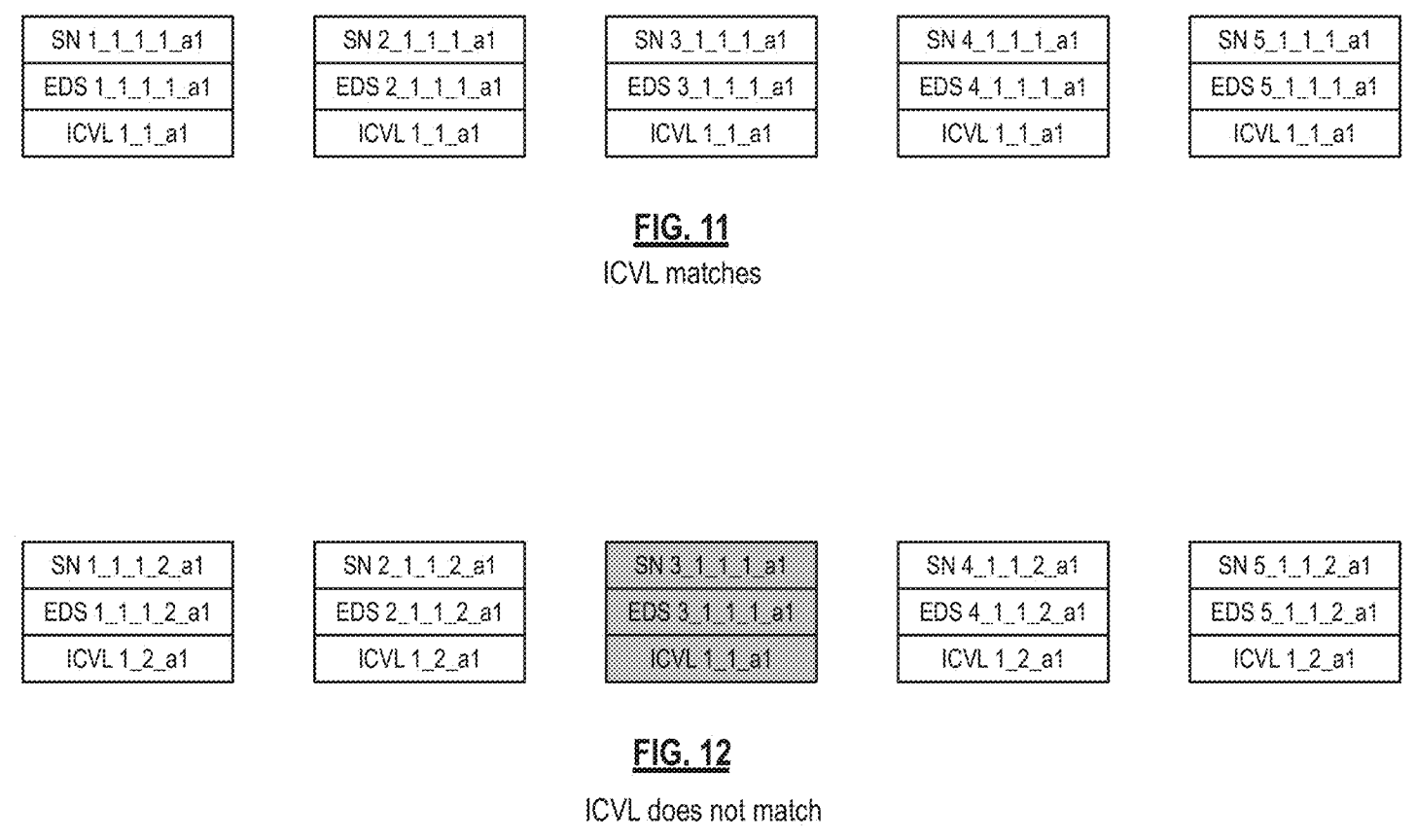

FIG. 11 is a schematic block diagram of an example of a set of integrity check value list (ICVL) encoded data slices (EDS) having substantially matching ICVLs. In this example, a requesting computing device issued a read request to the storage units for set 1 of the plurality of sets of encoded data slices of data object "a1". Each of the responding storage units (e.g., a decode threshold, a read threshold, all, etc.) respond by providing the slice name, the encoded data slice, and the integrity check value list (ICVL).

In this example, each slice has the same list (e.g., ICVL 1_1_a1) indicating to the requesting device that the slices are current and accurate (e.g., have not been corrupted due to failing hardware, hardware being offline, and/or unauthorized modifications, deletions, etc.). Note that, for a list or rebuild check request, the storage units would respond with the slice name and the ICVL, omitting the EDS.

FIG. 12 is a schematic block diagram of an example of a set of integrity check value list (ICVL) encoded data slices (EDS) having a mismatching ICVL. In this example, a requesting computing device issued a read request to the storage units for revision 2 of set 1 of the plurality of sets of encoded data slices of data object "a1". Each of the responding storage units (e.g., a decode threshold, a read threshold, all, etc.) respond by providing the slice name, the encoded data slice, and the integrity check value list (ICVL).

In this example, slice #3 has a different list (e.g., ICVL 1_1_a1) than the list of the other slices (e.g., ICVL 1_2_a1). When a mismatch in the lists is detected, the computing device determines a likely cause for the mismatch. A likely cause includes, but is not limited to, a storage unit having failing memory, a storage unit being off line during a revision update, an error in transmission, and/or unauthorized modifications, deletions, etc. In this example, the mismatch is likely due to the storage unit being offline during a revision update since the revision number of EDS #3 is not the same as the revision number of the other EDSs. As such, the computing device would initiate a rebuild function for encoded data slice #3 of set 1 of data object a1.

FIG. 13 is a schematic block diagram of another example of a set of integrity check value list (ICVL) encoded data slices (EDS) having a mismatching ICVL. In this example, a requesting computing device issued a read request to the storage units for revision 1 of set 1 of the plurality of sets of encoded data slices of data object "a1". Each of the responding storage units (e.g., a decode threshold, a read threshold, all, etc.) respond by providing the slice name, the encoded data slice, and the integrity check value list (ICVL).

In this example, slice #4 has a different list (e.g., ICVL 1'_1'_a1') than the list of the other slices (e.g., ICVL 1_1_a1). When a mismatch in the lists is detected, the computing device determines a likely cause for the mismatch. In this example, the computing device computes an integrity check value (ICV) of EDS 4_1_1_1_a1 and/or of SN 4_1_1_1_a1. If the newly computed ICV matches the ICV in the ICL list, then the likely cause for the mismatch is the storage unit having failing memory and/or an error in transmission. When this is the case, the requesting computing device can use EDS #4 in recovering the corresponding data segment with confidence that it is current and accurate.

FIG. 14 is a schematic block diagram of another example of a set of integrity check value list (ICVL) encoded data slices (EDS) having a mismatching ICVL. In this example, a requesting computing device issued a read request to the storage units for revision 1 of set 1 of the plurality of sets of encoded data slices of data object "a1". Each of the responding storage units (e.g., a decode threshold, a read threshold, all, etc.) respond by providing the slice name, the encoded data slice, and the integrity check value list (ICVL).

In this example, slice #3 has a different list (e.g., ICV 3_1_1_a1) than the list of the other slices (e.g., ICVL 1_1_a1). In particular, the ICV list of slice #3 is not a list, but the integrity check value. With this type of mismatch, the computing device determines the likely cause to be an unauthorized modification of slice #3. In this instance, the computing device initiates a corrective measure, which includes rebuilding the EDS when deemed to be a non-harmful unauthorized modification; decommissioning the storage unit; quarantining the storage unit (e.g., restrict and control communication with the storage unit), and/or a higher level of security regarding access to the storage unit.

FIG. 15 is a logic diagram of an example of a method of creating one or more sets of integrity check value list (ICVL) encoded data slices (EDS). The method begins at step 90 where a computing device dispersed storage error encodes a data segment of a data object into a set of encoded data slices (EDSs). The method continues at step 92 where the computing device generates a set of integrity check values (ICVs) for a set of encoded data slices. Examples of generating the ICVs were previously discussed.

The method continues at step 94 where the computing device generates an integrity check value list (ICVL) from the set of integrity check values. FIGS. 9A and 10A provide examples of generating the list. The method continues at step 96 where the computing device appends the integrity check value list (ICVL) to each encoded data slice of the set of encoded data slices to produce a set of ICVL encoded data slices. FIGS. 9B and 10B provide examples of appending the list. The method continues at step 98 where the computing device sends the set of ICVL encoded data slices to the set of storage units of the DSN for storage therein.

FIG. 16 is a logic diagram of an example of a method of accessing one or more sets of integrity check value list (ICVL) encoded data slices (EDS). The method begins at step 100 where the computing device (e.g., the one that created the set of ICVL EDSs) and/or another computing device (e.g., authorized to access the set of ICVL EDSs) retrieve a read threshold number of integrity check value list (ICVL) encoded data slices of a set of ICVL encoded data slices from at least some of the storage units. Note that the read threshold is a number of desired responses to a read request in a range between the decode threshold and the pillar width number. For example, the computing device and/or the other computing devices issues a read request, a list request, or a rebuild check request to the storage units. The storage units respond based on the type of request as discussed with reference to FIGS. 9B and 10B.

The method continues at step 102 where the computing device and/or the other one, determines whether the appended ICVL of each ICVL encoded data slice substantially match. If yes, the method continues at step 104, where the computing device and/or the other one processes the request (e.g., read, list, rebuild check, etc.)

When one more of the appended ICVL of one of the ICVL encoded data slices does not substantially match the others, the method continues at step 106 where the computing device and/or the other one determines a likely cause for the mismatch. The method continues at step 108 where the computing device and/or the other one determines whether the likely cause is a missed revision update (e.g., as discussed with reference to FIG. 12).

If yes, the method continues at step 110 where the computing device and/or the other one initiates rebuilding of the encoded data slice. The method continues at step 112 where the computing device and/or the other one generates an integrity check value for the rebuilt encoded data slice. The method continues at step 114 where the computing device and/or the other one generates an updated integrity check value list including the integrity check value for the rebuilt encoded data slice and integrity check values of the encoded data slices of the other ICVL encoded data slices.

The method continues at step 116 where the computing device and/or the other one appends the updated integrity check value list to the rebuilt encoded data slice to produce a rebuild ICVL encoded data slice. The method continues at step 118 where the computing device and/or the other one sends the rebuilt ICVL encoded data slice one of the storage units for storage therein.

When the likely cause for the mismatch is not a missed revision update, the method continues at step 120 where the computing device and/or the other one determines whether the likely cause is an inaccurate integrity check value list (ICVL) appended to the one of the ICVL encoded data slices (e.g., as discussed with reference to FIG. 13). If yes, the method continues at step 124 where the computing device and/or the other one calculates a new integrity check value for an encoded data slice portion of the one of the ICVL encoded data slices. The method continues at step 126 where the computing device and/or the other one extracts the integrity check value for the slice from the appended ICVL of another slice.

The method continues at step 128 where the computing device and/or the other one determines whether the new integrity check value substantially matches the extracted integrity check value. If yes, the method continues at step 130 where the computing device and/or the other one uses the encoded data slice in recovering the data segment. If not, the method continues at step 110.

When the likely cause is not an inaccurate integrity check value list (ICVL) appended to the slice, the method continues at step 122 where the computing device and/or the other one takes corrective measures for an unauthorized modification. For example, the computing device and/or the other one sends a delete message to a storage unit storing the one of the ICVL encoded data slices. As another example, the computing device and/or the other one initiates a rebuild process as discussed in steps 110-118. As yet another example, the computing device and/or the other one initiates a decommissioning of the storage unit, a quarantine of the storage unit, and a higher level of security regarding access to the storage unit.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
retrieving, by a computing device of a dispersed storage network (DSN) or another computing device of the DSN, a read threshold number of integrity check value list (ICVL) encoded data slices of a set of ICVL encoded data slices from at least some storage units of a set of storage units;
determining, by the computing device or the other computing device, whether an appended ICVL of each ICVL encoded data slice of the read threshold number of ICVL encoded data slices substantially match;
when the appended ICVL of one of the ICVL encoded data slices of the read threshold number of ICVL encoded data slices does not substantially match the appended ICVL of other ICVL encoded data slices of the read threshold number of ICVL encoded data slices:
determining, by the computing device or the other computing device, a likely cause for the appended ICVL of the one of the ICVL encoded data slices not substantially matching the appended ICVL of the other ICVL encoded data slices; and
when the likely cause is missing a revision update:
initiating, by the computing device or the other computing device, rebuilding of the encoded data slice portion of the one of the ICVL encoded data slices to produce a rebuilt encoded data slice;
generating, by the computing device or the other computing device, an integrity check value for the rebuilt encoded data slice;
generating, by the computing device or the other computing device, an updated integrity check value list including the integrity check value for the rebuilt encoded data slice and integrity check values of the encoded data slices of the other ICVL encoded data slices;
appending, by the computing device or the other computing device, the updated integrity check value list to the rebuilt encoded data slice to produce a rebuild ICVL encoded data slice; and
sending, by the computing device or the other computing device, the rebuilt ICVL encoded data slice to one of the storage units of the set of storage units for storage therein.

2. The method of claim 1 further comprises:
generating, by the computing device, a set of integrity check values for a set of encoded data slices, wherein a data segment of a data object is dispersed storage error encoded to produce the set of encoded data slices;
generating, by the computing device, an integrity check value list from the set of integrity check values;
appending, by the computing device, the integrity check value list (ICVL) to each encoded data slice of the set of encoded data slices to produce a set of ICVL encoded data slices; and
sending, by the computing device, the set of ICVL encoded data slices to the set of storage units of the DSN for storage therein.

3. The method of claim 1 further comprises:
when the likely cause is an inaccurate integrity check value list (ICVL) appended to the one of the ICVL encoded data slices:
calculating a new integrity check value for an encoded data slice portion of the one of the ICVL encoded data slices;

extracting the integrity check value from the appended ICVL of one of the other ICVL encoded data slices to produce an extracted integrity check value;
comparing the new integrity check value with the extracted integrity check value; and
when the new integrity check value substantially matches the extracted integrity check value, utilizing the encoded data slice in decoding of the read threshold number of encoded data slices to recover the data segment.

4. The method of claim 3 further comprises:
when the new integrity check value does not substantially match the extracted integrity check value:
  initiating, by the computing device or the other computing device, rebuilding of the encoded data slice portion of the one of the ICVL encoded data slices to produce a rebuilt encoded data slice;
  generating, by the computing device or the other computing device, an integrity check value for the rebuilt encoded data slice;
  generating, by the computing device or the other computing device, an updated integrity check value list including the integrity check value for the rebuilt encoded data slice and integrity check values of the encoded data slices of the other ICVL encoded data slices;
  appending, by the computing device or the other computing device, the updated integrity check value list to the rebuilt encoded data slice to produce a rebuild ICVL encoded data slice; and
  sending, by the computing device or the other computing device, the rebuilt ICVL encoded data slice one of the storage units of the set of storage units for storage therein.

5. The method of claim 1 further comprises:
when the likely cause is an unauthorized modification of the one of the ICVL encoded data slices, sending, by the computing device or the other computing device, a delete message to a storage unit storing the one of the ICVL encoded data slices to delete the one of the ICVL encoded data slices.

6. The method of claim 1 further comprises:
when the likely cause is an unauthorized modification of the one of the ICVL encoded data slices:
  initiating, by the computing device or the other computing device, rebuilding of the encoded data slice portion of the one of the ICVL encoded data slices to produce a rebuilt encoded data slice;
  generating, by the computing device or the other computing device, an integrity check value for the rebuilt encoded data slice;
  generating, by the computing device or the other computing device, an updated integrity check value list including the integrity check value for the rebuilt encoded data slice and integrity check values of the encoded data slices of the other ICVL encoded data slices;
  appending, by the computing device or the other computing device, the updated integrity check value list to the rebuilt encoded data slice to produce a rebuild ICVL encoded data slice; and
  sending, by the computing device or the other computing device, the rebuilt ICVL encoded data slice one of the storage units of the set of storage units for storage therein.

7. The method of claim 1 further comprises:
when the likely cause is an unauthorized modification of the one of the ICVL encoded data slices, determining, by the computing device or the other computing device, whether other encoded data slices stored by a storage unit storing the one of the ICVL encoded data slices have been modified in an unauthorized manner; and
when the other encoded data slices stored by the storage unit have been modified in the unauthorized manner, initiating, by the computing device or the other computing device, at least one of a decommissioning of the storage unit, a quarantine of the storage unit, and a higher level of security regarding access to the storage unit.

8. A computer readable memory comprises:
a first memory element that stores operational instructions that, when executed by a computing device of a dispersed storage network (DSN) or another computing device of the DSN, causes the computing device or the other computing device to:
  retrieve a read threshold number of integrity check value list (ICVL) encoded data slices of a set of ICVL encoded data slices from at least some storage units of a set of storage units;
  determine whether an appended ICVL of each ICVL encoded data slice of the read threshold number of ICVL encoded data slices substantially match;
  when the appended ICVL of one of the ICVL encoded data slices of the read threshold number of ICVL encoded data slices does not substantially match the appended ICVL of other ICVL encoded data slices of the read threshold number of ICVL encoded data slices, determine a likely cause for the appended ICVL of the one of the ICVL encoded data slices not substantially matching the appended ICVL of the other ICVL encoded data slices;
a second memory element that stores operational instructions that, when executed by the computing device or the computing device, causes the computing device or the other computing device to:
  when the likely cause is missing a revision update:
    initiate rebuilding of the encoded data slice portion of the one of the ICVL encoded data slices to produce a rebuilt encoded data slice;
    generate an integrity check value for the rebuilt encoded data slice;
    generate an updated integrity check value list including the integrity check value for the rebuilt encoded data slice and integrity check values of the encoded data slices of the other ICVL encoded data slices;
    append the updated integrity check value list to the rebuilt encoded data slice to produce a rebuild ICVL encoded data slice; and
    send the rebuilt ICVL encoded data slice to one of the storage units of the set of storage units for storage therein.

9. The computer readable memory of claim 8 further comprises:
a third memory element that stores operational instructions that, when executed by the computing device, causes the computing device to:
  generate a set of integrity check values for a set of encoded data slices, wherein a data segment of a data object is dispersed storage error encoded to produce the set of encoded data slices;

generate an integrity check value list from the set of integrity check values;
append the integrity check value list (ICVL) to each encoded data slice of the set of encoded data slices to produce a set of ICVL encoded data slices; and
send the set of ICVL encoded data slices to the set of storage units of the DSN for storage therein.

10. The computer readable memory of claim 8 further comprises:
a third memory element that stores operational instructions that, when executed by the computing device or the computing device, causes the computing device or the other computing device to:
when the likely cause is an inaccurate integrity check value list (ICVL) appended to the one of the ICVL encoded data slices:
calculate a new integrity check value for an encoded data slice portion of the one of the ICVL encoded data slices;
extract the integrity check value from the appended ICVL of one of the other ICVL encoded data slices to produce an extracted integrity check value;
compare the new integrity check value with the extracted integrity check value; and
when the new integrity check value substantially matches the extracted integrity check value, utilize the encoded data slice in decoding of the read threshold number of encoded data slices to recover the data segment.

11. The computer readable memory of claim 10, wherein the third memory element further stores operational instructions that, when executed by the computing device or the computing device, causes the computing device or the other computing device to:
when the new integrity check value does not substantially match the extracted integrity check value:
initiate rebuilding of the encoded data slice portion of the one of the ICVL encoded data slices to produce a rebuilt encoded data slice;
generate an integrity check value for the rebuilt encoded data slice;
generate an updated integrity check value list including the integrity check value for the rebuilt encoded data slice and integrity check values of the encoded data slices of the other ICVL encoded data slices;
append the updated integrity check value list to the rebuilt encoded data slice to produce a rebuild ICVL encoded data slice; and
send the rebuilt ICVL encoded data slice one of the storage units of the set of storage units for storage therein.

12. The computer readable memory of claim 8 further comprises:
a third memory element that stores operational instructions that, when executed by the computing device or the computing device, causes the computing device or the other computing device to:
when the likely cause is an unauthorized modification of the one of the ICVL encoded data slices, send a delete message to a storage unit storing the one of the ICVL encoded data slices to delete the one of the ICVL encoded data slices.

13. The computer readable memory of claim 8 further comprises:
a third memory element that stores operational instructions that, when executed by the computing device or the computing device, causes the computing device or the other computing device to:
when the likely cause is an unauthorized modification of the one of the ICVL encoded data slices:
initiate rebuilding of the encoded data slice portion of the one of the ICVL encoded data slices to produce a rebuilt encoded data slice;
generate an integrity check value for the rebuilt encoded data slice;
generate an updated integrity check value list including the integrity check value for the rebuilt encoded data slice and integrity check values of the encoded data slices of the other ICVL encoded data slices;
append the updated integrity check value list to the rebuilt encoded data slice to produce a rebuild ICVL encoded data slice; and
send the rebuilt ICVL encoded data slice one of the storage units of the set of storage units for storage therein.

14. The computer readable memory of claim 8 further comprises:
a third memory element that stores operational instructions that, when executed by the computing device or the computing device, causes the computing device or the other computing device to:
when the likely cause is an unauthorized modification of the one of the ICVL encoded data slices, determine whether other encoded data slices stored by a storage unit storing the one of the ICVL encoded data slices have been modified in an unauthorized manner; and
when the other encoded data slices stored by the storage unit have been modified in the unauthorized manner, initiate at least one of a decommissioning of the storage unit, a quarantine of the storage unit, and a higher level of security regarding access to the storage unit.

* * * * *